United States Patent [19]

Krausse et al.

[11] 4,322,452

[45] Mar. 30, 1982

[54] PROCESS FOR PASSIVATING SEMICONDUCTOR MEMBERS

[75] Inventors: Jürgen Krausse, Baldham; Wilhelm Ladenhauf, Puchheim, both of Fed. Rep. of Germany

[73] Assignee: Siemens Aktiengesellschaft, Berlin and Munich, Fed. Rep. of Germany

[21] Appl. No.: 178,750

[22] Filed: Aug. 18, 1980

Related U.S. Application Data

[63] Continuation of Ser. No. 917,475, Jun. 21, 1978, abandoned.

[30] Foreign Application Priority Data

Jul. 5, 1977 [DE] Fed. Rep. of Germany ....... 2730367

[51] Int. Cl.³ .......................................... H01L 21/314
[52] U.S. Cl. ........................................ 427/82; 427/86; 427/99; 357/52
[58] Field of Search ................ 427/86, 82, 99; 357/52

[56] References Cited

U.S. PATENT DOCUMENTS

| | | | |
|---|---|---|---|
| 2,789,258 | 4/1957 | Smith | 357/52 |
| 3,765,940 | 10/1973 | Hentzschel | 427/85 |
| 3,806,361 | 4/1974 | Lehner | 357/52 |
| 4,084,986 | 4/1978 | Aoki et al. | 427/94 |
| 4,086,613 | 4/1978 | Biet et al. | 357/54 |
| 4,134,125 | 1/1979 | Adams et al. | 357/54 |
| 4,179,528 | 12/1979 | Losee et al. | 427/86 |

FOREIGN PATENT DOCUMENTS 300472 4/1968 Sweden ................................ 357/53

OTHER PUBLICATIONS

Matsushita et al., "Semi-insulating polycrystalline-silicon (Sipos) Passivation Technology" Japanese Journal of Applied Physics, 15, Suppl. 15-1, pp. 35-40 (1976).

*Primary Examiner*—John D. Smith
*Attorney, Agent, or Firm*—Herbert L. Lerner

[57] ABSTRACT

Passivating a semiconductor device by vapor depositing a layer of silicon and thereafter tempering the deposited layer of silicon. As a result of the tempering, a drastic reduction in the blocking current in the blocking direction and the blocking current in the trigger direction of the semiconductor device are achieved.

4 Claims, 3 Drawing Figures

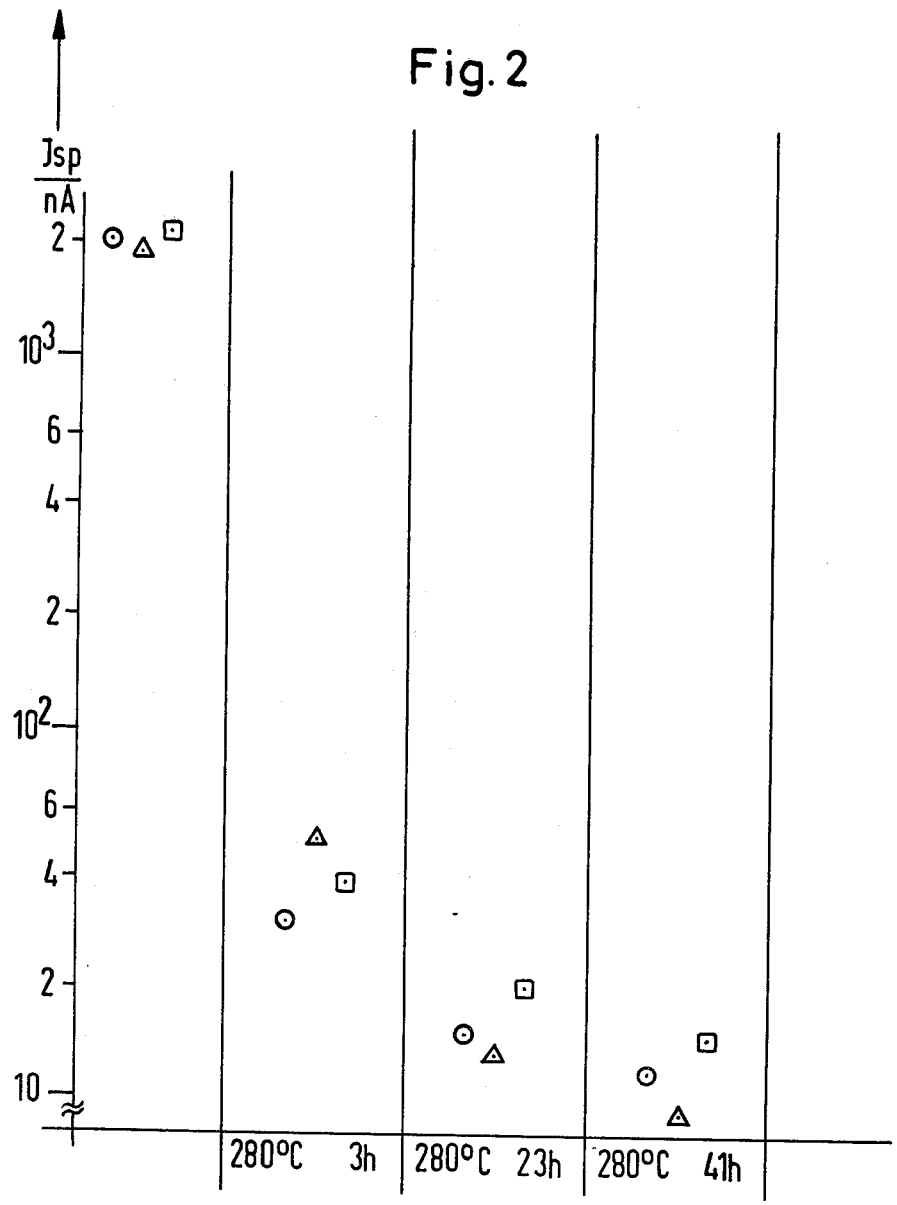

PROCESS FOR PASSIVATING SEMICONDUCTOR MEMBERS

This is a continuation of application Ser. No. 917,475, filed June 21, 1978, now abandoned.

BACKGROUND OF THE INVENTION

1. Field of Invention

The present invention relates to a process for the passivation of semiconductor devices and more particularly refers to a new and improved method of passivation by the application of a silicon layer.

2. Description of the Prior Art

The application of a polycrystalline silicon layer to a semiconductor device is shown in U.S. Pat. No. 3,971,061.

In semiconductor components a fundamental problem consists in maintaining stable the current-voltage characteristics. In the case of rectifiers and transistors, these are in particular the characteristics in the blocking direction, whereas in the case of thyristors attention should be paid to the stability of the characteristics both in the blocking direction and in the trigger direction. It is general prior art to passivate the surfaces of the semiconductor elements of the aforesaid semiconductor components by applying one or more than one organic or inorganic covering layer. The use of lacquers, rubbers or glasses is known for this purpose. Generally an adequate stability of the characteristics can be achieved with the aid of these covering layers. However, occasionally instabilities occur, the cause of which can be found in unrecognized changes in the properties of the covering layers and/or in the surface of the semiconductor element. During production this continuously leads to strong fluctuations in the yield of utilizable semiconductor components.

A process has been described by means of which a semiconductor element is passivated by a thermally growing silicon layer. This passivation process necessitates temperatures of between 600° and 700° C. which means that it cannot be employed in already contacted and possible soldered components. Furthermore the silicon must be etched away at the points at which it is not required. In addition, this process can lead to a considerable reduction in the carrier life time in volume and on the surface.

SUMMARY OF THE INVENTION

An object of the present invention is to provide a process for the passivation of semiconductor devices with simple application of the silicon and without the occurrence of the aforementioned disadvantages. Furthermore, in the passivated semiconductor device in accordance with the present invention, the currents flowing in the blocked state of the semiconductor element are low.

With the foregoing and other objects in view, there is provided in accordance with the invention, a process for the passivation of semiconductor devices by the application of a silicon layer, including vapor depositing a layer of silicon and thereafter tempering the vapor deposited layer of silicon.

Other features which are considered as characteristic for the invention are set forth in the appended claims.

Although the invention is illustrated and described herein as embodied in a process for the passivation of semiconductor devices, it is nevertheless not intended to be limited to the details shown, since various modifications may be made therein without departing from the spirit of the invention and within the scope and range of equivalents of the claims.

BRIEF DESCRIPTION OF THE DRAWINGS

The invention, however, together with additional objects and advantages thereof will be best understood from the following description when read in connection with the accompanying drawings, in which:

FIG. 2 is a diagram showing the blocking current of a passivated semiconductor device without tempering and also with tempering for different periods of time.

DETAILED DESCRIPTION OF THE INVENTION

In accordance with the invention the silicon is vapor deposited and thereafter the vapor deposited layer is tempered. The layer may be tempered at temperatures above room temperature to the crystallization temperature of the vapor deposited silicon. The temperature of tempering is preferably within the range of 100° C. above room temperature to about 600° C., desirably in the range of 200° to 400° C. In the case of already contacted semiconductor members, i.e. applying metal contacts to the semiconductor member, it is advisable to carry out the tempering at temperatures which lie below the melting temperature of the metal applied to the semiconductor member.

Particularly favorable results can be attained if the tempering is carried out in an atmosphere containing oxygen.

The invention will be explained in detail making reference to an exemplary embodiment in association with FIGS. 1 and 3 and to the diagram shown in FIG. 2.

Figure 1:
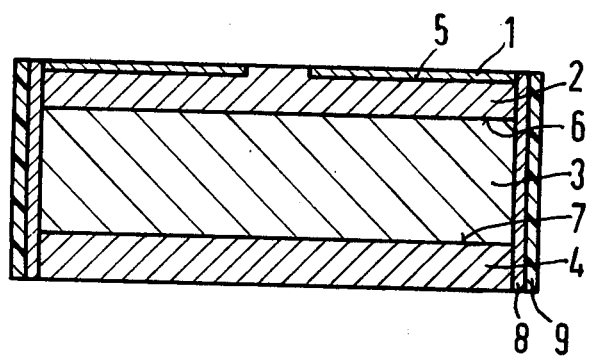
FIG. 1 diagrammatically illustrates in sectional view, a thyristor semiconductor device.

FIG. 1 illustrates the semiconductor member of a thyristor in a sectional view. This member possesses four zones, the cathode-end emitter zone 1, the cathode-end base zone 2, the inner base zone 3 and the anode-end emitter zone 4. pn-junctions 5, 6, 7 lie between the aforementioned zones. The semiconductor member consists of silicon, and the zones 1, 2, 3 and 4 are doped in the usual manner in accordance with the purpose of use of the semiconductor component.

At the edge of the semiconductor member, at least at those points at which the pn-junctions appear at the surface, there is vapor deposited a silicon protective layer 8 which for example can have a thickness of 0.1 $\mu$m or even more, for example 1 $\mu$m. Those surfaces of the semiconductor element on which there is to be no vapor deposition, are covered prior to the vapor deposition. In order to increase the dielectric breakdown resistance and in order to improve the mechanical protection, a further protective layer 9 which may consist for example of rubber or of another protective lacquer can be applied to the vapor deposited silicon layer 8.

In order to set the resistivity, the vapor deposited silicon layer 8 may contain dopants such as for example boron or phosphorus. The dopant content in layer 8 is obtained by vaporizing one or more than one of these substances with the silicon. In order to set the resistivity the layer 8 may also contain one or more than one metal such as for example aluminum. The metals can likewise be incorporated by vapor deposition with the silicon. In order to set the resistivity the layer 8 may also contain oxygen. Oxygen can be incorporated by vapor depositing in an atmosphere containing oxygen. By changing the resistivity of the layer 8 it is possible to set the potential conditions at the edge of the semiconductor element. Thus, for example, the layer 8 can be doped with phosphorus and have a resistivity of $10^8$ Ohm cm.

The silicon layer 8 was vapor deposited in a vacuum vapor deposition system at a pressure of approximately $6.5 \cdot 10^{-4}$ Pa ($5 \cdot 10^{-6}$ Torr). A silicon block, for example, can be used as the silicon source. The silicon can be vaporized by means of an electron beam. With an acceleration voltage of 8 kV and a current of approximately 0.5 A a vapor deposition rate of 0.25 $\mu$m/min was achieved. This can be raised by increasing the energy of the electron beam for example to 0.5 $\mu$m/min and above.

The silicon can also be vapor deposited by means of an ion beam by direct current flow or by inductive heating. It is also possible to vapor deposit the silicon by radiation heat.

The layer 8 can also consist of a plurality of consecutively vapor deposited layers each having different properties. In this manner a change in the specific resistance via the thickness and an influencing of the potential conditions at the edge surface of the semiconductor element are effected.

The vapor deposited silicon layer 8 is tempered following the vapor deposition on the semiconductor member. The tempering is carried out at a temperature preferably of at least 100° C. above room temperature to the crystallization temperature of the silicon. The crystallization temperature of the silicon lies between 700 and 900 K according to published information. Where metal contacts have already been disposed in the semiconductor member, the tempering is carried out at a temperature which lies below the melting temperature of the material used for contacting, for example soft solder, or other metal. As a result of the tempering, a drastic reduction in the blocking current in the blocking direction and the blocking current in the trigger direction of the semiconductor device may be achieved.

FIG. 2 shows that the blocking current was $2 \cdot 10^3$ nA in a specific type of semiconductor without tempering. After a tempering period of three hours at 280° C. the blocking current was between 3 and $5 \cdot 10^1$ nA for three measured examples. After 23 and 41 hours of tempering time at 280° C., further reductions in the blocking currents were observed. The time for tempering will vary with the temperature and the optimum time may readily be obtained by simple testing as shown in FIG. 2.

The vapor deposition of the silicon itself can be carried out at room temperature. The temperature of the subsequent heat treatment can then be selected to be such that the desired reduction in the blocking currents is obtained without injury for example, to semiconductor components containing metal contacts. Thus, in accordance with the invention, soldered and contacted chips can be passivated so that no masking or no selected etching of the chips is necessary.

Semiconductor elements which have been passivated by the vapor deposition of a silicon layer and subsequent tempering exhibited surprisingly good stability of the characteristics at a low current level. This applied both to the blocking characteristics in the backwards direction in the case of diodes and transistors, and also to the blocking characteristics in the backwards direction and trigger direction in the case of thyristors. In the case of thyristors the so-called Yoshida effect also no longer occurred which causes a drastic increase in the blocking currents after preceding forward loading.

Figure 3:
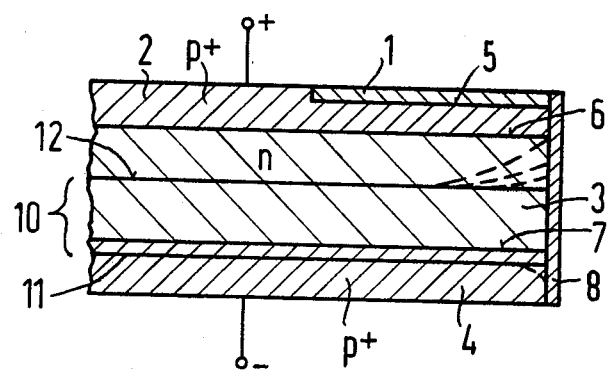
FIG. 3 diagrammatically illustrates the form of the space charge zone of a semiconductor device when the pn-junction is stressed in the blocking direction.

The stability of the characteristics can be seen from FIG. 3 which illustrates the form of the space charge zone when the pn-junction 7 is stressed in the blocking direction. At the beginning of the blocking load, the boundaries 11, 12 of the space charge zone 10 run for example parallel to the pn-junctions. If a blocking load prevails for a longer period of time, the space charge zone widens in that the boundary 12 of the space charge zone 10 at the edge of the semiconductor element is displaced in the direction towards the pn-junction 6. At the same time the boundary 11 of the space charge zone 10 moves away from the pn-junction 7, although only to a considerably weaker extent as the zone 4 is more greatly doped than the zone 3. The widening of the space charge zone is illustrated in broken lines in FIG. 3. With continuing widening of the space charge zone, an increase occurs in the blocking current until, when the pn-junction 6 is reached at the edge, the so-called punch-through effect occurs when the pn-junction 7 loses its blocking capacity. The widening also takes place at the pn-junction 6 when the semiconductor element is loaded by a voltage in the reverse direction, i.e. in the trigger direction.

As a result of the passivation layer in accordance with the invention, the space charge zone 10 no longer widens at the edge. This can be established for example with the known light-electric method of investigating the space charge zones at the edge of a semiconductor element. This means that no increase occurs in the blocking currents or in other words that the characteristics remain stable in the blocking direction.

The invention has been described in association with a semiconductor member for a thyristor. However, it can also be employed in diodes, transistors and other semiconductor components. It can equally be used in Mesa or Planar structures. An important feature consists in vapor depositing silicon onto at least that zone in which the pn-junctions appear at the surface of the semiconductor member.

There are claimed:

1. In a process for the passivation of semiconductor devices by the application of a silicon layer, the improvement comprising applying energy to a body of silicon maintained under a vacuum to generate silicon vapors by evaporation from the body of silicon, depositing the evaporated silicon vapors as a layer of silicon on the semiconductor device and thereafter tempering the deposited layer of silicon at temperatures above room temperature to below the crystallization temperature of the vapor deposited silicon for a period of time of at least three hours.

2. Process as claimed in claim 1, wherein the evaporated vapor deposited layer of silicon is tempered at a temperature within the range of 100° C. above room temperature to about 600° C.

3. Process as claimed in claim 1 or 2, wherein the evaporated vapor deposited layer of silicon is tempered at temperatures which lie below the melting temperature of a metal applied to the semiconductor device.

4. Process as claimed in claims 1 or 2, wherein the tempering is carried out in an atmosphere containing oxygen.

* * * * *